(12) United States Patent
Khandavalli

(10) Patent No.: US 9,899,970 B2
(45) Date of Patent: Feb. 20, 2018

(54) CURRENT ENHANCED DRIVER FOR HIGH-POWER SOLID-STATE RADIO FREQUENCY POWER AMPLIFIERS

(71) Applicant: Eridan Communications, Inc., Santa Clara, CA (US)

(72) Inventor: Chandra Khandavalli, Livermore, CA (US)

(73) Assignee: Eridan Communications, Inc., Santa Clara, CA (US)

( * ) Notice: Subject to any disclaimer, the term of this patent is extended or adjusted under 35 U.S.C. 154(b) by 150 days.

(21) Appl. No.: 14/743,046

(22) Filed: Jun. 18, 2015

(65) Prior Publication Data

US 2016/0373063 A1    Dec. 22, 2016

(51) Int. Cl.
H03F 1/02      (2006.01)
H03F 3/193     (2006.01)
H03F 3/24      (2006.01)
H03F 3/30      (2006.01)

(52) U.S. Cl.
CPC .......... *H03F 3/193* (2013.01); *H03F 1/0227* (2013.01); *H03F 3/245* (2013.01); *H03F 3/3001* (2013.01); *H03F 2200/102* (2013.01); *H03F 2200/108* (2013.01); *H03F 2200/408* (2013.01); *H03F 2200/411* (2013.01); *H03F 2200/451* (2013.01)

(58) Field of Classification Search
CPC ................................... H03F 3/193; H03F 1/02
USPC ........................................ 330/295, 310, 250
See application file for complete search history.

(56) References Cited

U.S. PATENT DOCUMENTS

| | | | | |
|---|---|---|---|---|
| 4,975,823 A | * | 12/1990 | Rilly | H02M 3/338 363/21.16 |
| 5,081,400 A | * | 1/1992 | Weber | G09G 3/2927 315/169.1 |
| 7,965,522 B1 | * | 6/2011 | Hornberger | H02M 1/08 363/21.1 |
| 2006/0044856 A1 | * | 3/2006 | Bird | H02M 3/1588 363/131 |
| 2011/0025397 A1 | * | 2/2011 | Wang | H03K 19/018521 327/333 |

(Continued)

OTHER PUBLICATIONS

Sep. 9, 2016, International Search Report (ISR) and Written Opinion (WO) from International Searching Authority (ISA) in related International Patent Appl. No. PCT/US2016/028063.

*Primary Examiner* — Patricia T Nguyen
(74) *Attorney, Agent, or Firm* — Patent Law Professionals, P.C.; William E. Winters (57) ABSTRACT

A high-power solid-state RFPA includes an output stage having a power transistor and a current enhanced driver that drives the output stage. The current enhanced driver includes an inductor and first and second transistors arranged in totem-pole-like configuration. When the first transistor is turned on and the second transistor is turned off, the inductor supplies a first charging current to the output stage, to assist in charging the input gate-source capacitor (Cgs) of the power transistor in the output stage. The first transistor further provides a second charging current that supplements the first charging current, thereby enhancing charging of the gate-source capacitor Cgs. Conversely, when the first transistor of the driver is turned off and the second transistor is turned on, the second transistor provides a discharge path through which the gate-source capacitor Cgs can discharge.

17 Claims, 9 Drawing Sheets

(56) References Cited

U.S. PATENT DOCUMENTS

2011/0074376 A1\* 3/2011 Chen ................ H03F 3/217
323/283

\* cited by examiner

| HIGH POWER PA OUTPUT STAGE PERFORMANCE COMPARISON @ 2.5 GHz | | | |
|---|---|---|---|
| Figure of Merit | With Current Enhanced Driver | With Single-Ended Driver | Difference |
| Power Output $P_{RFOUT}$ | 4.2 W | 3.3 W | +28% |
| Drain Efficiency $\eta$ | 74.8% | 71% | +5% |
| Gain G | 43.8 dB | 42 dB | +1.8 dB |

CURRENT ENHANCED DRIVER FOR HIGH-POWER SOLID-STATE RADIO FREQUENCY POWER AMPLIFIERS

STATEMENT REGARDING FEDERALLY SPONSORED RESEARCH OR DEVELOPMENT

This invention was made with Government support under Contract No. FA8750-14-C-0099 awarded by the Air Force Research Laboratory on behalf of DARPA. The Government has certain rights in the invention.

BACKGROUND OF THE INVENTION

High-power solid-state radio frequency power amplifiers (RFPAs) are used in a wide variety of applications including, for example, wireless communications, jamming, imaging, radar, and RF heating.

Figure 1:
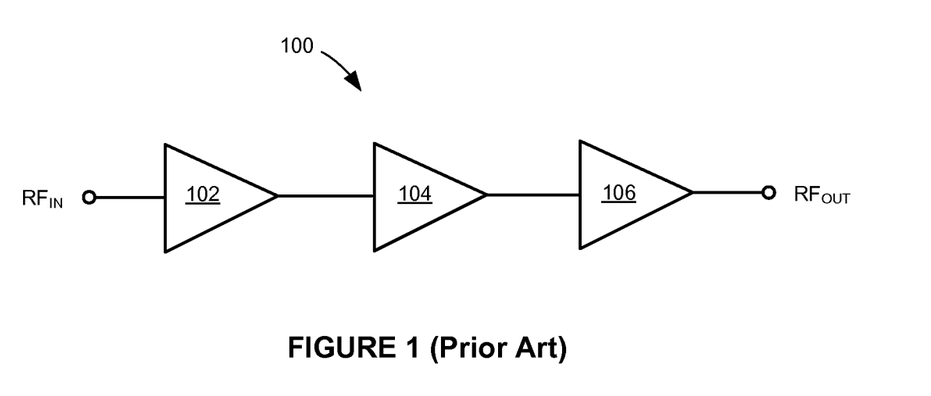
FIG. 1 is a simplified drawing of a multi-stage high-power solid-state radio frequency power amplifier (RFPA)

To achieve high gain, high-power solid-state RFPAs are often designed in multiple stages. FIG. 1 is a simplified drawing of a multi-stage high-power solid-state RFPA 100. The high-power solid-state RFPA 100 comprises an input stage 102, a driver stage 104, and a high-power output stage 106. The primary purpose of the high-power output stage 106 is to convert DC energy from its DC power supply to RF energy and thereby produce RF power that is significantly higher than the RF power applied to its input.

The efficiency of a multi-stage RFPA is heavily dependent upon the high-power output stage's ability to achieve fast slew rates. Unfortunately, the transistors used in the high-power output stages of multi-stage RFPAs must be large and therefore unavoidably have large input capacitances. The large input capacitances make fast slew rates very difficult to realize. The high-power output stage is the stage in the RFPA that consumes the majority of power. Consequently, in most applications, finding ways to make the high-power output stage operate as efficiently as possible is paramount. Since the driver stage controls the operation of the high-power output stage, how the driver stage is designed substantially affects how efficient the high-power output stage can possibly be. For this reason, the driver stage deserves special attention.

BRIEF SUMMARY OF THE INVENTION

High-power solid-state radio frequency power amplifiers (RFPAs) and methods utilizing a current enhanced driver are disclosed. An exemplary high-power solid-state RFPA includes a high-power output stage and a current enhanced driver that is configured to drive the high-power output stage. The current enhanced driver includes first and second transistors (e.g., first and second gallium nitride high electron mobility transistors (GaN-HEMTs)) arranged in totem-pole-like (or push-pull like) configuration, and further includes an inductor coupled to an output of the current enhanced driver. When the first transistor is turned on and the second transistor is turned off, the inductor coupled to the output of the current enhanced driver operates as a current source and supplies a first charging current to the high-power output stage. The first charging current helps in charging the input gate-source capacitor (Cgs) of the high-power output stage's main power transistor, which in one embodiment of the invention is a high-power GaN-HEMT. Additionally, the first transistor provides a second charging current that is combined with and supplements the first charging current, thereby enhancing the charging of the input capacitor Cgs. Conversely, when the first transistor of the current enhanced driver is turned off and the second transistor is turned on, the second transistor provides a discharge path through which the input capacitor Cgs discharges. The ability of the current enhanced driver to rapidly charge and discharge the input capacitor (Cgs) of the high-power output stage's main power transistor allows the high-power output stage to produce high magnitude drain voltages and high magnitude drain currents at its output with very short and symmetric rise and fall transition times. The short and symmetric rise and fall transition times result in low power dissipation in the high-power output stage, thereby increasing the overall efficiency of the high-power solid-state RFPA and allowing the high-power solid-state RFPA to operate efficiently at very high RF output powers and very high output frequencies.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 2:
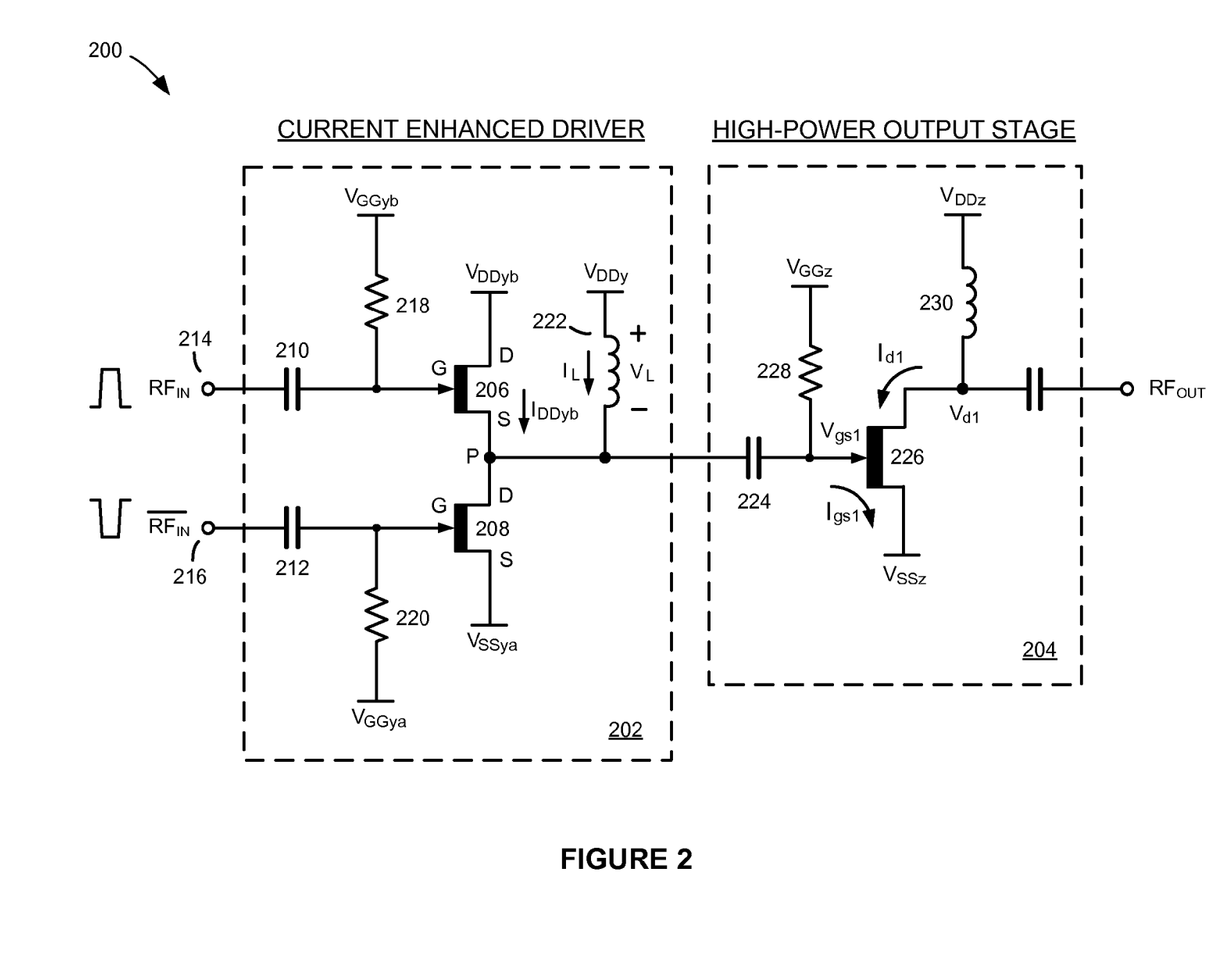
FIG. 2 is a schematic drawing of a high-power solid-state RFPA with a current enhanced driver configured to drive a high-power output stage, according to an embodiment of the present invention.

Referring to FIG. 2, there is shown a high-power solid-state radio frequency power amplifier (RFPA) 200, according to an embodiment of the present invention. The high-power solid-state RFPA 200 comprises a current enhanced driver 202 and a high-power output stage 204 that is configured to be driven by the current enhanced driver 202. The current enhanced driver 202 includes first and second n-channel depletion mode field-effect transistors (FETs) 206 and 208 that are connected in a totem-pole-like configuration, with the source of the first FET 206 connected to the drain of the second FET 208 at a circuit node "P". In one embodiment of the invention, the first and second FETs 206 and 208 are gallium-nitride (GaN) high-electron mobility transistors (or GaN-HEMTs). However, those of ordinary skill in the art will appreciate and understand that other solid-state devices (e.g., other n-channel depletion mode FETs or FET-like devices) made of the same or other types of semiconducting materials may be used. The drain of the first FET 206 is connected to a drain supply voltage $VDD_{yb}$, and source of the second FET 208 is connected to a source supply voltage $VSS_{ya}$. AC coupling capacitors 210 and 212 are coupled between the gates of the first and second FETs 206 and 208 and first and second input terminals 214 and 216. The first input terminal 214 is configured to receive a first RF input signal RFin and the second input terminal 216 is configured to receive a second RF signal $\overline{\text{RFin}}$ that is 180 degrees out of phase with respect to the first RF input signal RFin. First and second DC bias resistors 218 and 220 are also connected to the gates of the first and second FETs 206 and 208, and serve to set the DC operating points of the first and second FETs 206 and 208. Finally, an inductor 222 is connected to the output of the current enhanced driver 202, which is provided at node P. (Note that, although the inductor 222 is shown to receive a DC supply voltage $VDD_y$ that is separate from the DC supply voltage $VDD_{yb}$ applied to the drain of the first FET 206, the inductor 222 and first FET 206 can be alternatively configured to share the same DC supply voltage.)

The output of the current enhanced driver 202 is coupled to the input of the high-power output stage 204 via AC coupling capacitor 224. The high-power output stage 204 comprises a high-power n-channel depletion mode FET 226, which in one embodiment of the invention is configured in a common source topology, such as in FIG. 2. The high-power n-channel depletion mode FET 226 in the exemplary embodiment of the invention described here is a high-power GaN-HEMT. However, other solid-state devices (e.g., other n-channel depletion mode FETs or FET-like devices) made of the same or other types of semiconducting materials may be used. A DC bias resistor 228 is connected to the gate of the high-power n-channel depletion mode FET 226, and serves to set the DC operating point of the high-power n-channel depletion mode FET 226. Finally, an inductor 230, which receives a drain supply voltage $VDD_z$ and serves as an RF choke, is connected to the drain of the high-power n-channel depletion mode FET 226. Depending on the application, the drain supply voltage $VDD_z$ can either be a fixed DC voltage or a dynamic power supply voltage.

The first and second FETs 206 and 208 of the exemplary current enhanced driver 202 in FIG. 2 are depletion mode devices. Accordingly, without any RF voltage applied to their gates, a conducting channel is present and formed between their respective sources and drains. However, when the sum of the voltage of the second RF input signal $\overline{\text{RFin}}$ and the gate bias voltage applied to the gate of the second FET 208 exceeds (i.e., becomes more positive than) the threshold voltage $V_T$ of the second FET 208, the second FET 208 turns on. (Note that since the first and second RF input signals RFin and $\overline{\text{RFin}}$ are 180 degrees out of phase and the current enhanced driver 202 is a push-pull type of structure, the first FET 206 turns off when the second FET 208 turns on and vice versa.) Turning on the second FET 208 allows the input gate capacitor of the high-power FET 226 in the high-power output stage 204 to discharge through the drain-source path of the second FET 208, causing the conducting channel of the high-power FET 226 to deplete of electrons. As the input gate capacitor discharges, eventually the conducting channel between the drain and source of the high-power FET 226 pinches off so that no current can then flow from the high-power FET's 226's drain to its source.

Conversely, when the sum of the voltage of the second RF input signal $\overline{\text{RFin}}$ and the gate bias voltage applied to the gate of second FET 208 becomes less than (i.e., becomes more negative than) the threshold voltage $V_T$ of the second FET 208, the second FET 208 turns off and the first FET 206 turns on. When the first FET 206 turns on, it shunts the inductor 222, thereby causing the inductor 222 to operate as a current source. The inductor current $I_L$ supplied by the inductor 222 is used to charge the large input gate capacitor (Cgs) of the high-power output stage FET 226. This inductor current $I_L$ is supplemented by, in other words, "enhanced" by, the drain current $IDD_{yb}$ supplied by the drain power supply $VDD_{yb}$ of the current enhanced driver 202. Together, the inductor current $I_L$ and drain current $IDD_{yb}$ charge the input gate capacitor of the high-power output stage FET 226. Since the rate at which the input gate capacitor charges is determined by the current Igs1 supplied to it, enhancing the inductor current $I_L$ with the driver current $IDD_{yb}$ allows the input gate capacitor to be charged very rapidly. As the input gate capacitor charges, the conducting channel in the high-power output stage FET 226 eventually forms, thereby allowing current to flow from the high-power output stage FET's 226 drain to its source.

Figure 3A:
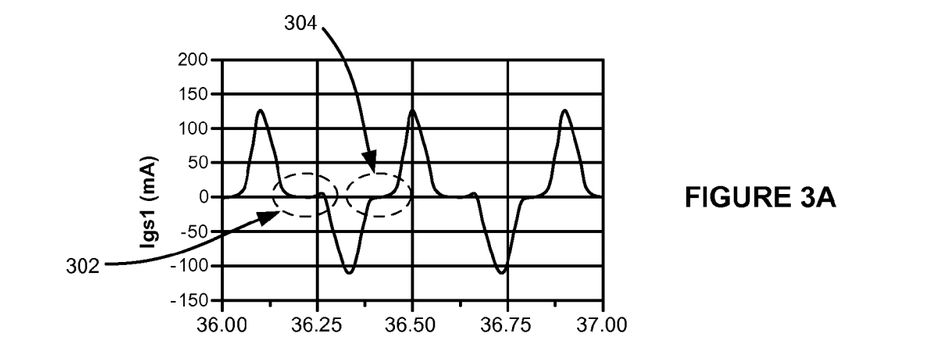
FIGS. 3A-3D are timing diagrams showing the gate-source current Igs1, gate-source voltage Vgs1, drain current Id1, and drain voltage Vd1 of the high-power output stage of the high-power solid-state RFPA in FIG. 2.
Figure 3B:
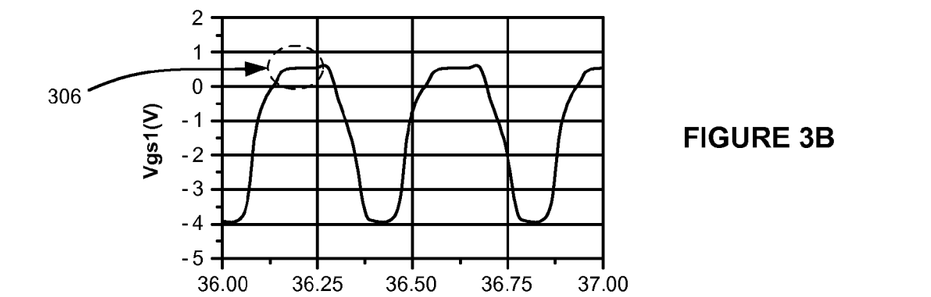

FIGS. 3A and 3B are timing diagrams of the gate-source current Igs1 and gate-source voltage Vgs1 of the high-power output stage FET 226, when the high-power output stage 204 is being driven by the current enhanced driver 202. The profiles of the gate-source current Igs1 and the gate-source voltage Vgs1 confirm that the input gate capacitor of the high-power output stage FET 226 does, in fact, charge and discharge very rapidly when driven by the current enhanced driver 202. Both the positive and negative current profiles of the gate-source current Igs1 rise and fall very rapidly and to a high value, indicating that charge movement is fast. The positive and negative current profiles also have the same general shape, indicating that the charge and discharge times are symmetric and approximately of the same duration. That the charge and discharge times are fast and that charging and discharging of the input gate capacitor are fully completed is also reflected by the fact that Igs1=0 for an extended duration between the 36.00 ns and 36.25 ns marks (indicated by the arrow labeled "302") and an extended duration between the 36.25 ns and 36.50 ns marks (indicated by the arrow labeled "304"). The time at which Igs1 first becomes zero during charging occurs at approximately the 36.125 ns mark, and is the approximate time at which the input gate capacitor has become fully charged. The time at which Igs1 first becomes zero during discharging occurs at approximately the 36.375 ns mark, and is the time at which the input gate capacitor has become fully discharged.

FIG. 3B also confirms that charging the input gate capacitor of the high-power output stage FET 226 ensues rapidly and completely. For example, between the 36.00 ns and 36.125 ns marks, the gate-source voltage Vgs1 is seen to rise rapidly and reach its maximum at approximately 36.125 ns, which is just about the same time that the gate current Igs1 falls to zero. The gate-source voltage Vgs1 then flattens out between the 36.125 ns and 36.25 ns marks (as indicated by the arrow with the label "306"). Flattening of the gate-source voltage Vgs1 is a further indication that the input gate capacitor of the high-power output stage FET 226 has completed charging. When Vgs1 becomes flat, dVgs1/dt≈0. Since during charging the input gate current Igs1 flowing into the input gate capacitor is related to the voltage Vgs1 that is developed across the input gate capacitor and Igs1=Cgs×dVgs1/dt, when dVgs1/dt becomes zero at approximately the 36.125 ns mark means that no current is flowing into the input gate capacitor and charging has completed.

Figure 3C:
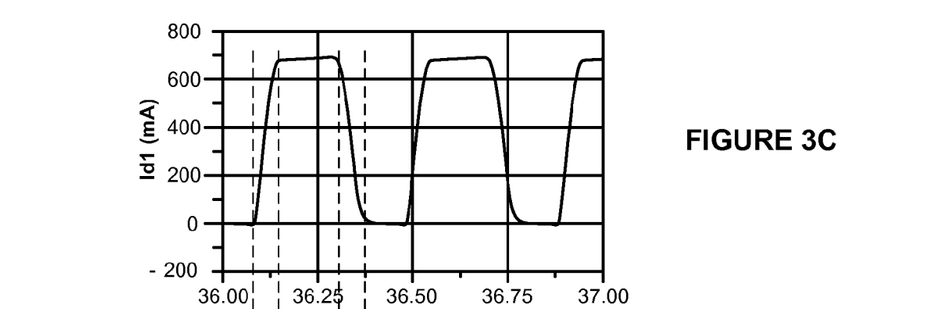
Figure 3D:
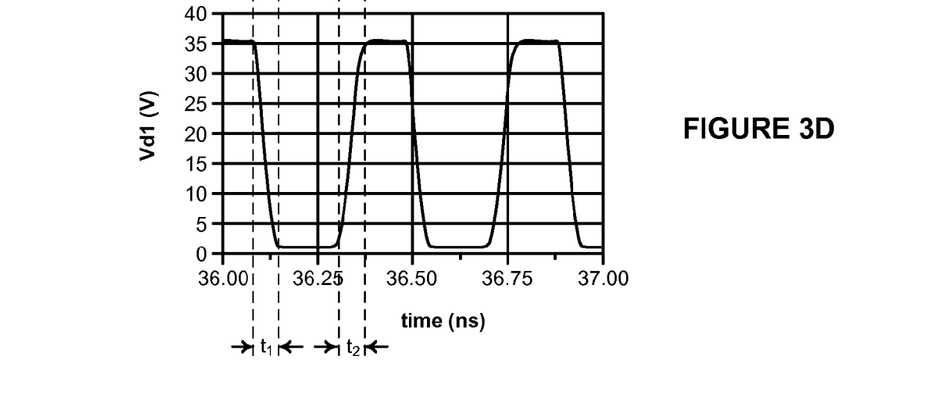

The fast and symmetric charge and discharge times that result by employing the current enhanced driver 202 to drive the high-power output stage 204, are further reflected in the drain current Id1 and drain voltage Vd1 timing diagrams presented in FIGS. 3C and 3D, where it is seen that the rise and fall transition times $t_1$ and $t_2$ of Id1 and Vd1 are short, symmetric, and approximately of the same duration.

Figure 4A:
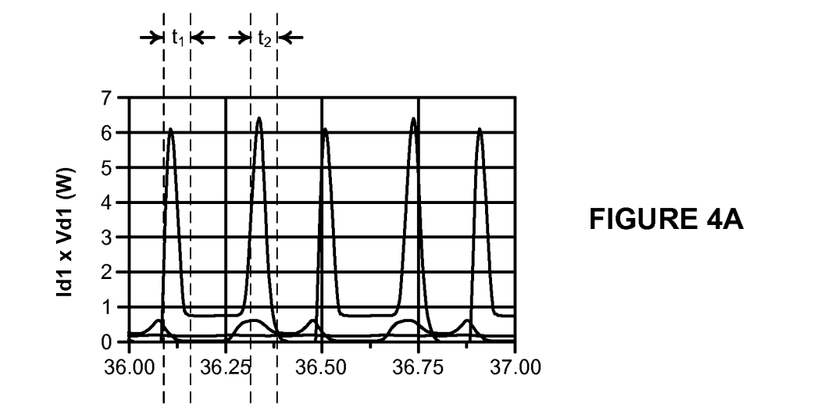
FIGS. 4A-4C are timing diagrams showing the power dissipation (Id1×Vd1), drain current Id1, and drain voltage Vd1 of the high-power output stage of the high-power solid-state RFPA depicted in FIG. 2.
Figure 4B:
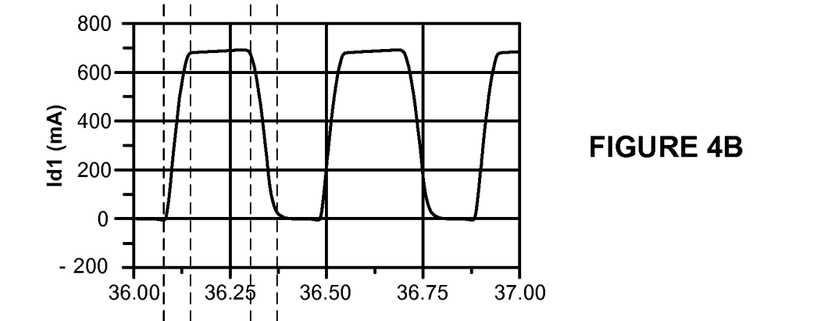
Figure 4C:
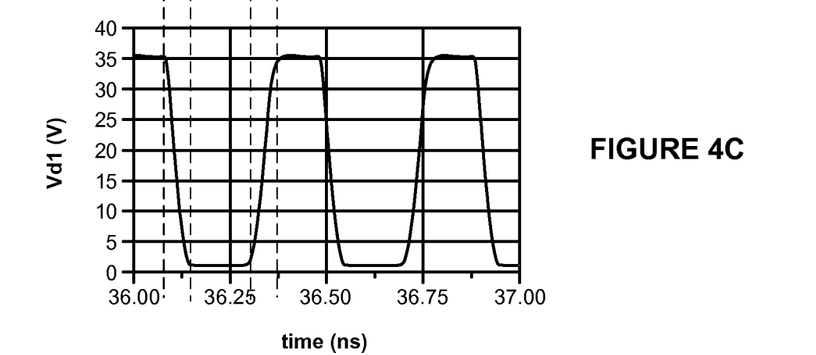

The ability of the current enhanced driver 202 to control the high-power output stage 204 so that it can produce large, symmetric, and rapid-transition drain currents Id1 and drain voltages Vd1 is important since it is during these transitions that the high-power output stage FET 226 dissipates the most power. FIG. 4A is a timing diagram showing the power dissipated (Id1×Vd1) by the high-power output stage FET 226, when the high-power output stage 204 is being driven by the current enhanced driver 202, and FIGS. 4B and 4C are timing diagrams of the resulting drain current Id1 and drain voltage Vd1 produced at the output of the high-power output stage FET 226. (Note that the drain current Id1 and drain voltage Vd1 profiles in FIGS. 4B and 4C are the same as that shown in FIGS. 3C and 3D but have been reproduced in FIGS. 4B and 4C to aid in the description of FIG. 4A.) As can be seen in FIG. 4A, the high-power output stage FET 226 does, in fact, dissipate power mostly during the times when the drain current Id1 and drain voltage Vd1 are transitioning and overlap. Since the rise and fall transition times $t_1$ and $t_2$ of Id1 and Vd1 are short, symmetric and approximately of the same duration (see FIGS. 4B and 4C), the power dissipation spikes in the power dissipation profile are also narrow and symmetric. Narrow and symmetric power dissipation spikes is highly desirable since it indicates that the high-power output stage FET 226 dissipates significant power only during the short periods of time when its input gate capacitor is charging and discharging and the drain current Id1 and drain voltage Vd1 are transitioning and overlap. The areas beneath the spikes represents wasted energy. However, the areas are small, indicating that the high-power output stage 204 is very efficient at converting DC energy from the output stage drain power supply $VDD_z$ to RF energy, when the output stage 204 is being driven by the current enhanced driver 202.

In addition to the benefit of the inductor 222 serving as a current source to assist in charging the large gate capacitor present at the input of the high-power output stage FET 226, the inductor 222 and its configuration in the current enhanced driver 202 provide the benefit of preventing the Schottky diode that is present at the input of the high-power output stage FET 226 from turning on. When the sum of the voltage of the first RF input signal RFin and gate bias voltage applied to the gate of the first FET 208 becomes greater than (i.e., becomes more positive than) the threshold voltage $V_T$ of the first FET 206, the first FET 206 turns on and shunts the inductor 222. Shunting the inductor 222 limits the voltage to which node P of the current enhanced driver 202 (see FIG. 2) can increase to, and allows the drain supply voltage $VDD_{yb}$ to be designed to supply a voltage that is less than the turn on voltage of the output stage input Schottky diode, thereby preventing the Schottky diode from ever turning on.

Figure 5:
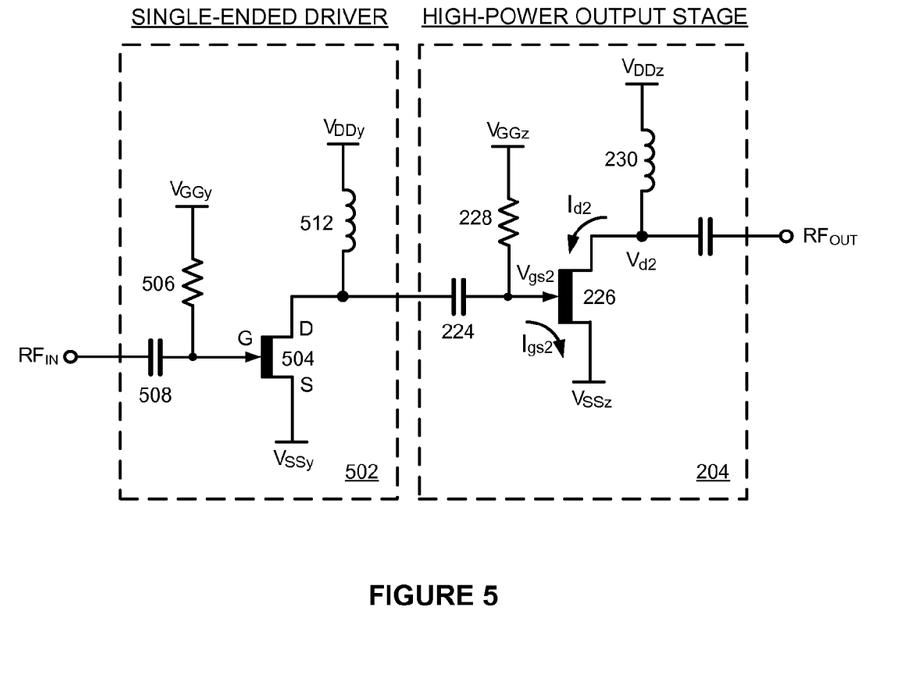
FIG. 5 is a schematic drawing showing the high-power output stage of the high-power solid-state RFPA in FIG. 2 being driven by a single-ended driver, instead of by the current enhanced driver of the high-power solid-state RFPA in FIG. 2.

To gauge the performance of the RFPA 200 and highlight the performance advantages gained by driving the high-power output stage by the current enhanced driver 202, the present inventor evaluated the capability of a single-ended driver in driving the same high-power output stage 204. FIG. 5 is a schematic diagram illustrating the test setup of the single-ended driver 502 being configured to drive the output stage 204. As shown the single-ended driver 502 includes an n-channel depletion mode FET 504; a DC bias resistor 506 connected to the gate of the FET 504; an AC coupling capacitor 508 coupled between an RF input terminal 510 and the gate of the FET 504; and an inductor 512 connected to the drain of the FET 504.

Figure 6A:
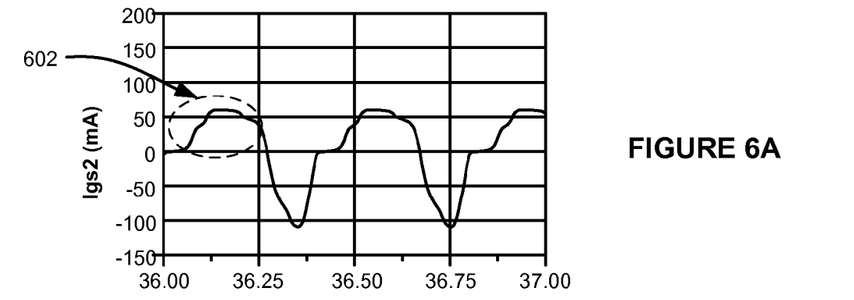
FIGS. 6A-6D are timing diagrams showing the gate-source current Igs2, gate-source voltage Vgs2, drain current Id2, and drain voltage Vd2 of the high-power output stage of the high-power solid-state RFPA in FIG. 2, when the high-power output stage is being driven by the single-ended driver in FIG. 5, instead of being driven by the current enhanced driver in FIG. 2 of the high-power solid state RFPA in FIG. 2, and illustrating the drawbacks and limitations of driving the high-power output stage with the single-ended driver.
Figure 6B:
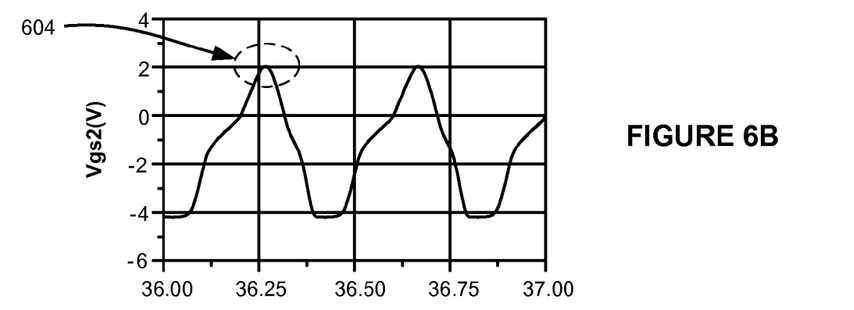
Figure 6C:
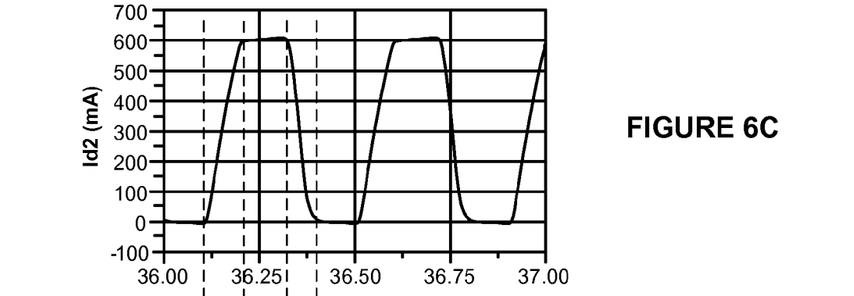
Figure 6D:
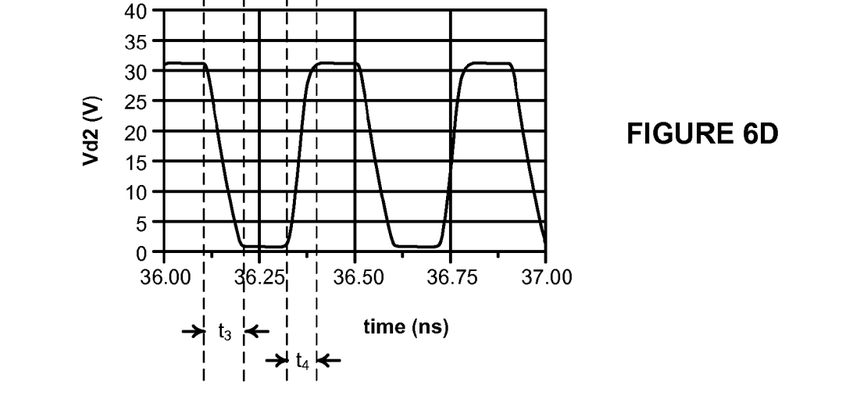

FIGS. 6A and 6B are timing diagrams showing the gate-source current Igs2, and gate-source voltage Vgs2 of the high-power output stage FET 226, when the output stage 204 is being driven by the single-ended driver 502. The gate-source current Igs2 (FIG. 6A) and gate-source voltage Vgs2 (FIG. 6B) reveal that the input gate capacitor of the high-power output stage FET 226 only supplies a maximum charging current (Igs2) of about 60 mA during the time the input gate capacitor of the high-power output stage FET 226 is charging. In contrast, and as illustrated in FIG. 2A, when the high-power output stage is being driven by the current enhanced driver 202 (i.e., as shown in FIG. 2), the maximum charging current (Igs1) is seen to reach as high as 125 mA. FIG. 6A also shows that when the high-power output stage 204 is being driven by the single-ended driver 502, the charging current Igs2 increase very slowly (as indicated by the arrow labeled "602"). In contrast, and as illustrated in FIG. 3A, when the high-power output stage 204 is being driven by the current enhanced driver 202, as in FIG. 2, the charging current Igs1 rises very rapidly and both the positive and negative current profiles are sharp and narrow. The low-magnitude, wide, flat, and slowly changing gate current profile Igs2 that results from driving the high-power output stage 204 using the single-ended driver 502 (as in FIG. 5) is due to the fact that the only current available to charge the input gate capacitor is the current that is supplied by the inductor 512. Unlike the current enhanced driver 202, in which the inductor current $I_L$ current is supplemented by the driver current $IDD_{yb}$ supplied by the drain power supply $VDD_{yb}$ (as in FIG. 2), no other current is available to charge the input gate capacitor in the configuration shown in FIG. 5. In other words, the charging current provided by the single-ended driver 502 is not enhanced.

The gate-source voltage Vgs2 profile in FIG. 6B also reveals that when the single-ended driver 502 is used to drive the high-power output stage 204, the gate source voltage Vgs2 transitions up very slowly and the input gate capacitor of the high-power output stage FET 226 never fully charges. Again, this deficiency is attributable to the fact that the only charging current available to charge the input gate capacitor of the high-power output stage FET 226 is that which can be provided by the inductor 512. FIG. 6B also reveals, as indicated by the arrow labeled "604," that the peak of the gate-source voltage Vgs2 exceeds the Schottky diode turn on voltage (which is approximately 1.3V for a GaN-HEMT) during times when the input gate capacitor of the output stage FET 226 is near peak charging. Turning on the Schottky diode of the high-power output stage FET 226 is undesirable in most any circumstance, but especially undesirable during discharging, since it opposes the ability to discharge the input gate capacitor of the high-power output stage FET 226. This problem is avoided when the current enhanced driver 202 is used, since, as discussed above, the current enhanced driver 202 clamps the voltage at node P (see FIG. 2) and prevents the Schottky diode from ever turning on. (Compare FIG. 6B to FIG. 3B.)

Figure 7A:
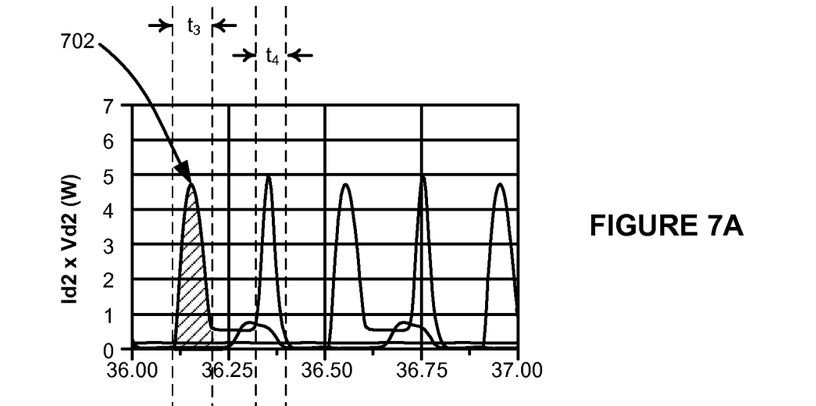
FIGS. 7A-7C are timing diagrams showing the power dissipation (Id2×Vd2), drain current Id2, and drain voltage Vd2 of the high-power output stage of the high-power solid-state RFPA in FIG. 2, when the high-power output stage is being driven by the single-ended driver in FIG. 5, instead of being driven by the current enhanced driver in FIG. 2 of the high-power solid state RFPA in FIG. 2, and illustrating the drawbacks and limitations of driving the high-power output stage with the single-ended driver.
Figure 7B:
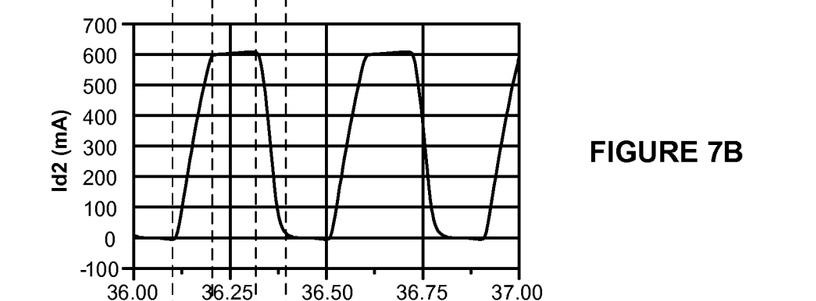
Figure 7C:
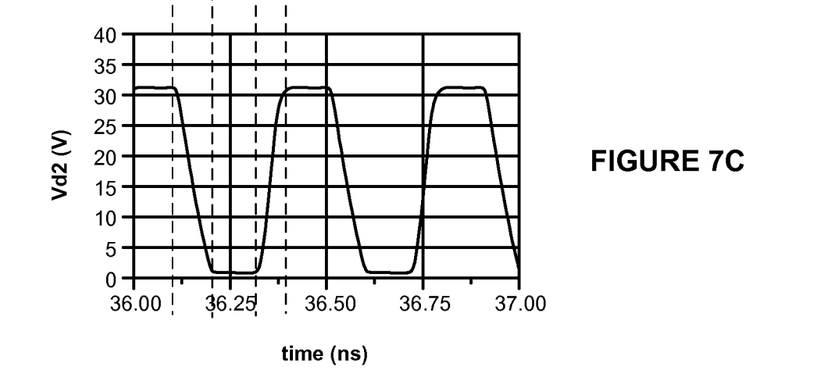

FIG. 7A is a timing diagram of the power dissipated (Id2×Vd2) by the high-power output stage FET 226 from FIG. 5 when the high-power output stage 204 is being driven by the single-ended driver 502, and FIGS. 7B and 7C are timing diagrams of the drain current Id2 and drain voltage Vd2 produced at the output of the high-power output stage FET 226 when the high-power output stage 204 is being driven by the single-ended driver 502. Similar to as when the current enhanced driver 202 is configured to drive the high-power output stage 204, when the single-ended driver 502 is configured to drive the high-power output stage 204, the high-power output stage FET 226 dissipates power mostly during times when the input gate capacitor of the high-power output stage FET 226 is charging and discharging and the drain current Id2 and drain voltage Vd2 are transitioning and overlap. However, by comparing FIGS. 7B and 7C to FIGS. 4B and 4C, it can be seen that the rise transition time $t_3$ is significantly longer when the single-ended driver 502 is used to drive the high-power output stage 204 (FIG. 5) than when the current enhanced driver is used to drive the high-power output stage (FIG. 2). In other words $t_3 \gg t_1$. The significantly longer rise transition time $t_3$ results in significantly greater power dissipation in the high-power output stage 204, compared to when the high-power output stage 204 is being driven by the current enhanced driver 202. This undesirable result, that follows from using the single-ended driver 502, is reflected in the power dissipation (Id2×Vd2) profile in FIG. 7A, where it is seen that the power dissipation spikes in the power dissipation are wider and of greater area than the power dissipation peaks that are produced when the high-power output stage 204 is being driven by the current enhanced driver 202. (Compare FIG. 7A to FIG. 4A.) The area beneath the power dissipation spikes in FIG. 7A represents wasted energy, and the wasted energy is most pronounced during the times the input gate capacitor of the high-power output stage FET 226 is being charged, as indicated by the shaded region 702 in FIG. 7A. The large shaded region 702 is an indication that the high-power output stage 204 is significantly less efficient at converting DC energy from the output stage drain power supply $VDD_y$ to RF energy when driven by the single-ended driver 502 than when the high-power output stage 204 is being driven by the current enhanced driver 202.

Figure 8:
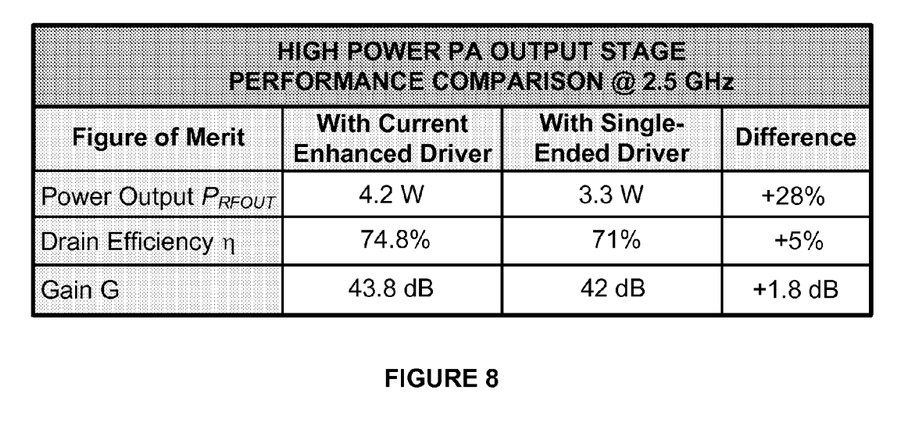
FIG. 8 is a table that lists and compares various performance characteristics (or "figures of merit") of the high-power output stage of the high-power solid-state RFPA in FIG. 2, when the high-power output stage is being driven by the current enhanced driver as shown in FIG. 2 and when the high-power output stage is alternatively being driven by the single-ended driver 502 in FIG. 5, instead of by the current enhanced driver in FIG. 2.

FIG. 8 is a table that lists and compares various performance characteristics (or "figures of merit") of the high-power output stage 204 when the high-power output stage 204 is being driven by the current enhanced driver 202 (as shown in FIG. 2), and when the high-power output stage 204 is alternatively being driven by the single-ended driver 502 in FIG. 5. The various performance characteristics show that when the high-power output stage 204 is being driven by the current enhanced driver 202, the example high-power output stage 204 produces 4.2 W of RF output power. This is 28% higher than the 3.3 W of RF output power that the example high-power output stage 204 produces when being driven by the single-ended driver 502. The drain efficiency η, which is a measure of how efficient the high-power output stage 204 is at converting the DC input power $P_{DC}$ supplied by the drain power supply VDDz to RF output power $P_{RFOUT}$ (i.e., $\eta = P_{RFOUT}/P_{DC}$), is also significantly higher (by about +5%) when the high-power output stage 204 is being driven by the current enhanced driver 202. Finally, the power gain $G=10 \log(P_{RFOUT}/P_{RFIN})$ of the high-power output stage 204 is about +1.8 dB higher (i.e., about 1.5 times higher) when the high-power output stage 204 is being driven by the current enhanced driver 202 than when it is being driven by the single-ended driver 502.

The multi-stage high-power solid-state RFPA 200 in FIG. 2, including the associated current enhanced driver 502, can be used in a wide variety of applications. For example, it can be used in wireless or wired communications applications. It may also be configured so that the high-power output stage 204 uses a fixed drain power supply, an adjustable drain supply, or a dynamic drain power supply, such as is used in a dynamic power supply transmitter (DPST), e.g., a polar transmitter, an envelope tracking (ET) transmitter, or a transmitter that utilizes envelope elimination and restoration (EER).

Figure 9:
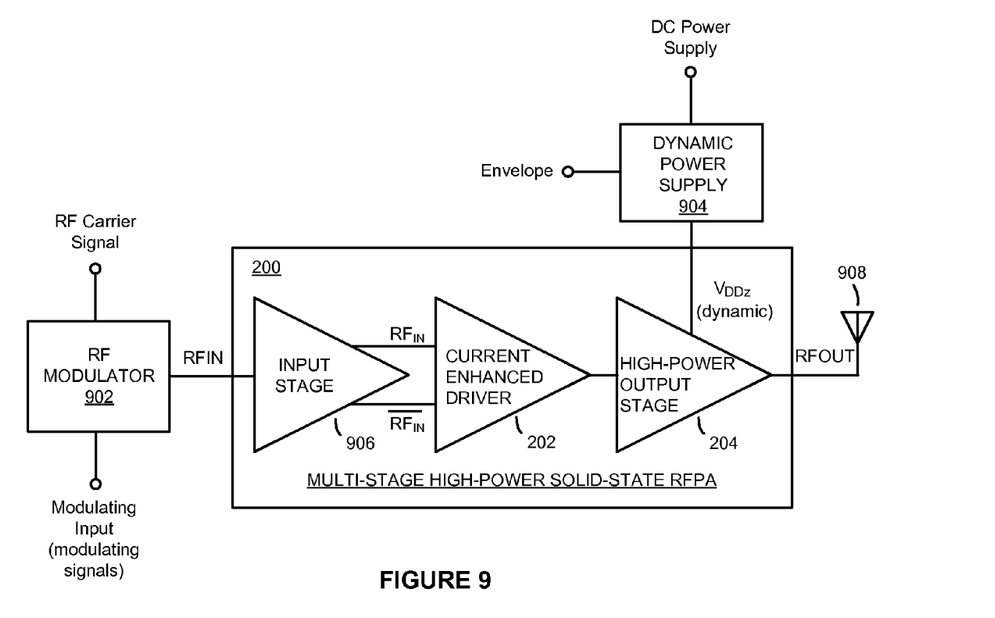
FIG. 9 is a drawing illustrating how the multi-stage high-power solid-state RFPA in FIG. 2 may be employed in a dynamic power supply transmitter (DPST), in accordance with one embodiment of the present invention.

FIG. 9 is a drawing illustrating how the multi-stage high-power solid-state RFPA 200 may be employed in a DPST 900. The DPST 900 comprises an RF modulator 902, the multi-stage high-power solid-state RFPA 200, and a dynamic power supply (DPS) 904. The RF modulator 902 operates to modulate an RF carrier signal by information-bearing amplitude and/or angle modulating signals or in-phase and quadrature-phase (I and Q) modulating signals, to produce an amplitude and/or angle modulated RF carrier signal RFIN. The amplitude and/or angle modulated RF carrier signal RFIN produced by the RF modulator 902 is coupled to an input of the input stage 906 and serves to: provide proper impedance matching between the RF modulator 902 and current enhanced driver 202, if necessary; amplify the modulated RF carrier signal RFIN, if necessary; and produce the first and second RF input signals RFin and $\overline{RFin}$ for the first and second inputs 214 and 216 of the current enhanced driver 202, as in FIG. 2. The input stage 906 may further include input signal conditioning and/or level shifting circuitry that conditions the edges of the modulated RF carrier signal RFIN and/or adjusts the high and low levels of the modulated RF signal RFIN so that they are optimized and/or compatible with the inputs of the current enhanced driver 202. Some signal conditioning and level shifting circuits that may be used or adapted for use for this purpose are described in U.S. patent application Ser. No. 14/447,452, entitled "Limiting Driver for Switch-Mode Power Amplifier," which is incorporated herein by reference. The current enhanced driver 202 and high-power output stage 204 operate similar to as described above. (It should be noted that in some applications the input stage 906 may not be needed, in which case the RF modulator 902 would be configured to generate the first and second RF input signals RFin and $\overline{RFin}$ and couple them directly to the input terminals 214 and 216 of the current enhanced driver 202.) The DPS 904 operates to modulate a direct current (DC) power supply voltage by an information-bearing or non-information-bearing signal envelope, and produce a dynamic power supply voltage $VDD_z$ which is coupled to the drain of the high-power output stage FET 226. The high-power output stage 204 is configured to operate as a switch-mode amplifier, remaining in compression while the dynamic power supply voltage $VDD_z$ varies. Accordingly, by applying the dynamically varying power supply voltage $VDD_z$ to the drain of the high-power output stage FET 226 and operating the high-power output stage 204 in compression, the amplitude information contained in the signal envelope is superimposed on the RF output signal RFOUT produced at the output of the high-power output stage 204. The high-power amplitude and/or angle modulated RF output signal may be then coupled to an antenna 908, to radiate the high-power amplitude and/or angle modulated RF output signal RFOUT to a remote receiver.

While various embodiments of the present invention have been presented, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments of the invention but, instead, should be determined by the appended claims, including the full scope of equivalents to which such claims are entitled.

What is claimed is:

1. A radio frequency power amplifier (RFPA), comprising:
    a high-power output stage including a first depletion mode field-effect transistor (FET); and
    a driver having a driver output node coupled to an input of said high-power output stage, said driver including a second depletion mode FET having a source connected to the driver output node, a third depletion mode FET having a drain connected to the source of the second depletion mode FET, and an inductor having a first terminal coupled to said driver output node and a second terminal configured to be connected to a first power supply,
    wherein the second depletion mode FET shunts the inductor when switched ON and supplies a current supplied from a second power supply that supplements an inductor current supplied by the inductor to charge an input gate capacitor of the first depletion mode FET.

2. The RFPA of claim 1, wherein said first and second solid-state devices are arranged and connected in a totem-pole-like configuration.

3. The RFPA of claim 1, wherein when said second depletion mode FET is switched OFF and said third depletion mode FET is switched ON, said third depletion mode FET provides a discharge path through which the input gate capacitor of the first depletion mode FET can discharge.

4. The RFPA of claim 1, wherein the first depletion mode FET comprises a high-power gallium nitride high electron mobility transistor (GaN-HEMT).

5. The RFPA of claim 4, wherein the second and third depletion mode FETs comprise second and third GaN-HEMTs.

6. A current enhanced driver for driving a capacitive load such as a high-power radio frequency power amplifier (RFPA), comprising:
    a first depletion mode field-effect transistor (FET) having a drain configured to be coupled to a first power supply and a gate configured to receive a first RF input signal RFin that switches the first depletion mode FET ON and OFF;
    a second depletion mode FET having a drain coupled to a source of the first depletion mode FET to form a driver output node and a gate configured to receive a second RF input signal RFin that is 180 degrees out-of-phase with respect the first RF input signal RFin and that switches the second depletion mode FET ON and OFF; and
    an inductor that is connected in shunt across the drain-source terminals of the first depletion mode FET, said inductor having a first terminal configured to be coupled to a second power supply and a second terminal coupled to the driver output node.

7. The current enhanced driver of claim 6, wherein the current enhanced driver is configured to drive a capacitive load and when the first depletion mode FET is switched ON, the first depletion mode FET provides a charging current that is combined with and supplements a charging current supplied by the inductor to enhance charging of said capacitive load.

8. The current enhanced driver of claim 7, wherein when said first depletion mode FET is switched OFF and said second depletion mode FET is switched ON, said second depletion mode FET provides a discharge path through which said capacitive load can discharge.

9. The current enhanced driver of claim 6, wherein the first and second depletion mode FETs comprise first and second gallium nitride (GaN) high electron mobility transistor (GaN-HEMTs).

10. The RFPA of claim 1, wherein the second power supply is the same as the first power supply.

11. The RFPA of claim 1, wherein the second depletion mode FET in shunt with the inductor serves to clamp a voltage at which the driver output node can rise to.

12. The RFPA of claim 11, wherein the voltage at which the driver output node is clamped is controlled to prevent an input Schottky diode of the first depletion mode FET from turning ON.

13. The RFPA of claim 1, wherein when switched ON the second depletion mode FET is configured to provide an excess current path through which extra current supplied by the inductor and not needed to charge the input gate capacitor of the first depletion mode FET can flow.

14. The RFPA of claim 1, further comprising:
    an AC coupling capacitor having a first terminal connected to the driver output node and a second terminal connected to a gate of the first depletion mode FET; and
    a DC biasing circuit coupled to the gate of the first depletion mode FET.

15. The current enhanced driver of claim 6, wherein the second power supply is the same as the first power supply.

16. The current enhanced driver of claim 6, wherein the first depletion mode FET in shunt with the inductor serves to clamp a voltage at which the driver output node can rise to.

17. The current enhanced driver of claim 7, wherein when switched ON the first depletion mode FET is configured to provide an excess current path through which extra current supplied by the inductor and not needed to charge the capacitive load can flow.

* * * * *

UNITED STATES PATENT AND TRADEMARK OFFICE
CERTIFICATE OF CORRECTION

PATENT NO. : 9,899,970 B2  
APPLICATION NO. : 14/743046  
DATED : February 20, 2018  
INVENTOR(S) : Chandra Khandavalli Page 1 of 1

It is certified that error appears in the above-identified patent and that said Letters Patent is hereby corrected as shown below:

In the Claims

Claim 2:  
Line 49, "first and second" should read --second and third--.  
Line 50, "solid-state devices" should read --depletion mode FETs--.

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*